(12) United States Patent
Feng et al.

(10) Patent No.: US 7,493,240 B1
(45) Date of Patent: Feb. 17, 2009

(54) METHOD AND APPARATUS FOR SIMULATING QUASI-PERIODIC CIRCUIT OPERATING CONDITIONS USING A MIXED FREQUENCY/TIME ALGORITHM

(75) Inventors: Dan Feng, Los Altos, CA (US); Joel R. Phillips, Sunnyvale, CA (US); Kenneth Kundert, Los Altos, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 09/570,709

(22) Filed: May 15, 2000

(51) Int. Cl.
*G06F 17/10* (2006.01)
(52) U.S. Cl. .............................. 703/2; 703/14; 703/41; 716/1; 716/6; 716/4
(58) Field of Classification Search .................... 703/2, 703/4, 14; 716/6, 1, 4, 5; 708/801; 324/76.39; 331/55; 374/1; 327/158
See application file for complete search history.

(56) References Cited

U.S. PATENT DOCUMENTS

| 5,588,142 | A |   | 12/1996 | Sharrit |         |
|-----------|---|---|---------|---------|---------|
| 5,867,416 | A | * | 2/1999  | Feldmann et al. | 708/801 |
| 5,995,733 | A |   | 11/1999 | Roychowdhury |       |
| 6,151,698 | A | * | 11/2000 | Telichevesky et al. | 716/1 |
| 6,154,716 | A | * | 11/2000 | Lee | 703/2 |
| 6,518,742 | B1| * | 2/2003  | Narayan et al. | 324/76.39 |

OTHER PUBLICATIONS

Kundert et al., A mixed frequency-time approach for finding the steady state solution o clocked analog circuits, IEEE 1988.*
Ricardo Telichevesky et al., "Efficient Steady-State Analysis based on Matrix-Free Krylov-Subspace Methods", Proceedings of the 1995 Design Automation Conference, Jun. 1995.
Makiko Okumura et al., "An Efficient Small Signal Frequency Analysis Method of Nonlinear Circuits with Two Frequency Excitations," IEEE Transactions On Computer-Aided Design, vol. 9, No. 3, Mar. 1990, pp. 225-235.

(Continued)

*Primary Examiner*—Paul L Rodriguez
*Assistant Examiner*—Kandasamy Thangavelu
(74) *Attorney, Agent, or Firm*—Vista IP Law Group, LLP

(57) ABSTRACT

Described is a process for performing an improved mixed frequency-time algorithm to simulate responses of a circuit that receives a periodic sample signal and at least one information signal. The process selects a set of evenly spaced distinct time points and a set of reference time points. Each of the reference points is associated with a distinct time point, and a reference time point is a signal period away from its respective distinct time point. The process finds a first set of relationships between the values at the distinct time points and the values at the reference time points. The process also finds a second set of relationships between the values at the distinct time points and the values at the reference time points. The process then combines the first and second sets of relationships to establish a system of nonlinear equations in terms of the values at the distinct time points only. By solving the system of nonlinear equations, the process finds simulated responses of the circuit in time domain. The process then converts the simulated circuit responses from time domain to frequency domain.

38 Claims, 8 Drawing Sheets

OTHER PUBLICATIONS

Kenneth S. Kundert et al., "A Mixed Frequency-Time Approach for Distortion Analysis of Switching Filter Circuits," IEEE Journal Of Solid-State Circuits, vol. 24, No. 2, Apr. 1989, pp. 443-451.

Robert C. Melville et al., "Efficient Multi-tone Distortion Analysis of Analog Intergrated Circuits," IEEE 1995 Custom Integrated Circuits Conference, pp. 241-244.

David Long et al., "Full-chip Harmonic Balance," IEEE 1997 Custom Integrated Circuits Conference, pp. 379-382.

Ricardo Telichevesky et al., "Receiver Characterization using Periodic Small-Signal Analysis," IEEE 1996 Custom Integrated Circuits Conference, pp. 449-452.

Jaijeet Roychowdhury, "Efficient Methods for Simulating Highly Nonlinear Multi-Rate Circuits," Design Automation Conference, DAC 97-Jun. 1997, Anaheim, CA, pp. 269-274.

Jaijeet Roychowdhury et al., "Cyclostationary Noise Analysis of Large RF Circuits with Multi-tone Excitations," IEEE 1997 Custom Integrated Circuits Conference, pp. 383-386.

Ricardo Telichevesky et al., "Efficient AC and Noise Analysis of Two-Tone RF Circuits," Proceedings of the 1996 Design Automation Conference, Jun. 1996.

Chen, J. et al. (1999) "A Mixed Frequency-Time Approach for Quasi-Periodic Steady-State Simulation of Multi-Level Modeled Circuits," *1999 IEEE International Symposium on Circuits and Systems*, 6:194-197.

Feng, D. et al. (1999) Efficient Computation of Quasi-Periodic Circuit Operating Conditions Via a Mixed Frequency/Time Approach, *Proceedings of the Design Automation Conference*, pp. 635-640.

Thodesen et al. "Parametric Harmonic Balance" IEEE 1996, pp. 1361-1364.

Chua et al. "Algorithms for computing almost periodic steady-state response of nonlinear systems to multiple input frequencies", IEEE Trans. Circuits and Systems, 29 (1981), pp. 953-971.

Kundert et al. "Steady-State Methods for Simulating Analog and Microwave Circuits" Kluwer Academic Publishers, Boston, 1990.

Saad et al. "A generalized minimal residual algorithm for solving nonsymmetric linear systems", SIAM J. Sci. Stat. Comput., 7 (1986), pp. 856-869.

Y. Thodesen, "Two stages method for efficient simulation of parametric circuits", PhD thesis, Department of telecommunication, the Norwegian institute of technology, 1996.

Telichevesky et al. "Receiver characterization using periodic small-signal analysis" Proceedings of the Custom Integrated Circuits Conference, May 1996.

Long et al. "Full Chip Harmonic Balance" Proceedings of the Custom Integrated Circuits Conference, May 1997.

K. Kundert, J. White, A. Sangiovanni-Vincentelli, A Mixed Frequency-Time Approach for Finding the Steady-State Solution of Clocked Analog Circuits, IEEE 1988 Custom Integrated Circuits Conference.

Jess Chen, Dan Feng, Joel Phillips, Ken Kundert, Simulation and Modeling of Intermodulation Distortion in Communication Circuits, Proceedings of the IEEE 1999, Custom Integrated Circuits Conference.

Weisstein, Eric W., "Matrix Driect Product," http://mathworld.wolfram.com/MatrixDirectProduct.html, 1996-2000 Eric W. Weisstein and Wolfram Research, Inc.

* cited by examiner

US 7,493,240 B1

METHOD AND APPARATUS FOR SIMULATING QUASI-PERIODIC CIRCUIT OPERATING CONDITIONS USING A MIXED FREQUENCY/TIME ALGORITHM

FIELD OF THE INVENTION

The present invention relates generally to analog circuit design simulations, and more specifically to analog circuit design simulations using a mixed frequency/time approach.

BACKGROUND OF THE INVENTION

Using a description language such as a netlist and device models an analog circuit can be first designed in terms of its predetermined inputs and expected outputs. The analog circuit design is then simulated before it is physically fabricated on a silicon chip.

One of the most difficult challenges in analog circuit stimulation is the analysis of the circuits that operate on multiple time scales. Typical examples of this type of circuits are switched-capacitor filters and circuits used in RF (radio frequency) communications systems. Applying standard transient analysis to a circuit of this type requires simulation of the detailed responses of the circuit over hundreds of thousands of clock cycles (millions of time points).

Many circuits of engineering interest are designed to operate near a time-varying, but quasi-periodic, operating point. Some of these circuits can be analyzed under the assumption that one of the circuit inputs produces a periodic response that can be directly calculated by steady-state algorithms, thus avoiding long transient simulation times. Under this assumption, all other time-varying circuit inputs are treated as small-signal by linearizing the circuit around the periodic operating point.

Existing algorithms are able to find periodic operating points and to perform periodic time-varying small-signal analysis. However, many circuits cannot be analyzed with the periodic-operating-point-plus-small-signal approach, because the above-described assumption may not apply. For example, predicting intermodulation distortion of a narrow-band circuit, such as a mixer-plus-filter circuit, involves calculating the nonlinear response of the mixer circuit, driven by an LO (local oscillator), to two high-frequency inputs that are closely spaced in frequency. The steady-state response of such a circuit is quasi-periodic.

The analog circuit simulation is further complicated by the fact that many multi-timescale circuits have a response (again mixers and switched-capacitor filters are typical examples) that is highly nonlinear with respect to at least one of the exciting inputs, and so steady-state approaches, such as the multi-frequency harmonic balance approach, do not perform well. To circumvent these difficulties, mixed frequency-time (MFT) algorithms have been proposed. Specifically, the MFT algorithms exploit the fact that many circuits of engineering interest have a strongly nonlinear response to only one input, such as the clock in the case of a switched-capacitor circuit, or local oscillator in the case of a mixer, but respond only in a weakly nonlinear manner to other inputs.

Unfortunately, existing MFT algorithms suffer from several drawbacks that prevent their application to practical circuits, particularly large circuits. In existing MFT algorithms, poor sample point selection leads to ill-conditioned simulation environment, in which simulation values may be unsolveable with acceptable accuracy. In addition, existing MFT algorithms are based on a matrix-explicit linear solver (via Gaussian elimination) whose computational cost (or time) is proportional to an order of $N^3$ for each Newton iteration, where N is the number of nodes of the circuit in simulation.

A new class of algorithms have been developed for simulating multi-timescale circuits by converting the circuit DAE (differential-algebraic equation) into an equivalent multi-variable partial differential equations (M-PDE). However, the effectiveness of the M-PDE method to simulate large circuits has yet to be proven. In addition, there is evidence that, for some circuits, the M-PDE method generates inaccurate simulation results.

There is, therefore, a need in the art for a method and apparatus that utilizes the MFT method to accurately simulate large circuits.

There is another need in the art for a method and apparatus utilizing the MFT method to simulate large circuits with reduced computational cost and increased speed.

There is still another need in the art for a method and apparatus for generating an efficient linear problem solver structured such that the MFT method can accurately simulate large circuits with improved convergence.

The present invention provides a method and apparatus to meet these and other needs.

SUMMARY OF THE INVENTION

To overcome the shortcomings of the available art, the present invention discloses a novel method and apparatus for simulating analog circuits by using a mixed frequency/time approach.

In broad terms, the present invention provides a method for simulating responses of a circuit, the circuit receiving a periodic sample signal and at least one information signal. The method comprises the steps of: selecting a set of distinct time points; defining a set of reference time points, wherein each of the reference time points is associated with one of the distinct time pints; establishing a first set of relationships between the values at the distinct time points and the values at the reference time points; establishing a second set of relationships between the values at the distinct time points and the values at the reference points; combining the first and second relationships to establishing a system of equations in terms of the values at the distinct time points; and finding responses of the circuit at the distinct time points by solving the established system of equations.

The present invention also provides a corresponding apparatus for performing steps in the method described above.

BRIEF DESCRIPTION OF THE DRAWING

The above mentioned advantages of the present invention as well as additional advantages will be more clearly understood as a result of a detailed description of the preferred embodiments of the invention when taken in conjunction with the following drawing in which.

DETAILED DESCRIPTION OF PREFERRED EMBODIMENTS

Figure 1:
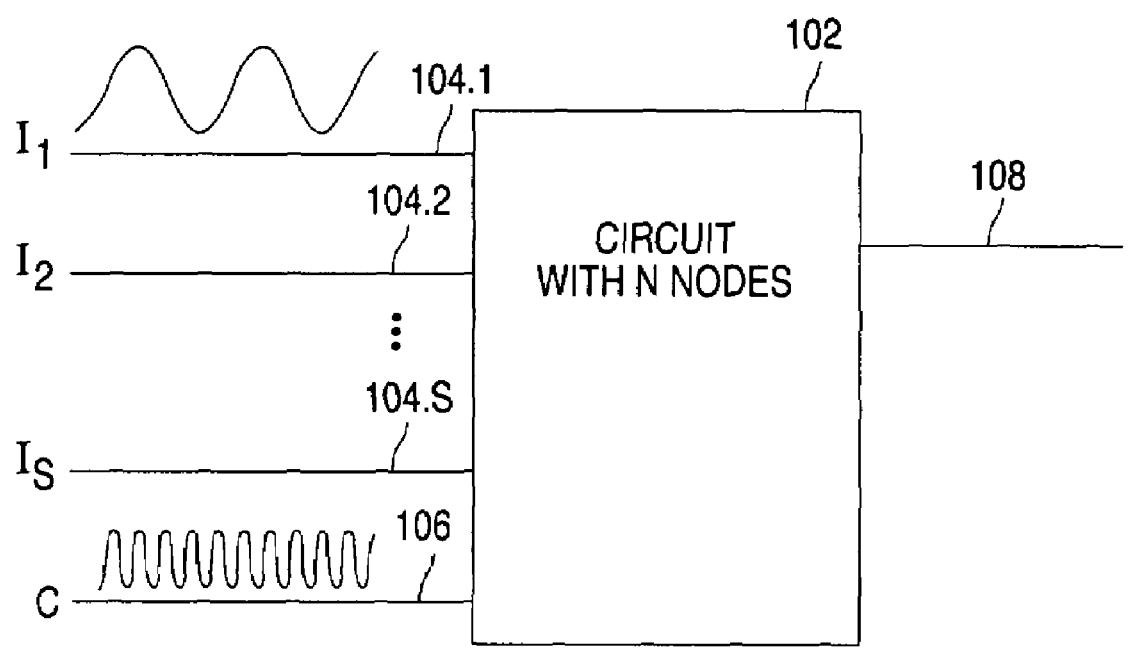
FIG. 1 shows circuit 102, which will be used to illustrate a simulation process in accordance with the present invention.

FIG. 1 shows circuit block 102 including N circuit nodes, which will be used to illustrate a simulation process in accordance with the present invention. Circuit 102 receives S information signals I1, I2, ..., Is from inputs 104.1, 104.2, ..., 104.s, respectively. Circuit 102 also receives a clock (or reference) signal C from input 106. In response to receipt of the input signals, circuit 102 generates a signal at output 108.

1. The Improved MFT Algorithm

The behavior of a circuit (such as circuit 102 in FIG. 1) can be described by a set of nonlinear differential-algebraic equations (DAEs) that can be written as $$\frac{d}{dt}Q(v(t)) + I(v(t)) + u(t) = 0, \quad (1)$$

Where $Q(v(t)) \in \Re^N$ is typically the vector of sums of capacitor charges at each node, $I(v(t)) \in \Re^N$ is the vector of sums of resistive currents at each node, $u(t) \in \Re^N$ is the vector of inputs, $v(t) \in \Re^N$ is the vector of node voltages, and N is the number of circuit nodes.

The present invention is particularly advantageous in situations where the input signal u(t) is quasiperiodic. A signal is L-quasiperiodic if it can be written as a Fourier series with L fundamental frequencies. RF circuits are generally influenced by one periodic timing signal, often referred to as the LO (local oscillator) or the clock, and one or more information signals. If $f_c$ denotes the clock signal frequency (such as the signal at input 106 shown in FIG. 1), and $f_1 \ldots f_s$ are the S information signals (shown in FIG. 1), then the (S+1)-quasiperiodic input can be written as:

$$u(t) = \sum_{k_1=-\infty}^{\infty} \ldots \sum_{k_s=-\infty}^{\infty} \sum_{k_c=-\infty}^{\infty} U(k_1, \ldots, k_s, k_c) \times \quad (2)$$

$$e^{-j2\pi k_1 f_1 t} \ldots e^{-j2\pi k_s f_s t} e^{j2\pi k_c f_c t}$$

In a preferred embodiment, the present invention utilizes two conditions to improve the simulation of quasi-periodic circuit operating conditions. The first condition is that the circuit of interest possesses a quasiperiodic steady-state response. That is, v(t) is an S+1 quasiperiodic signal with fundamentals $f_1, \ldots f_s, f_c$. The second condition is that all physical circuits have a finite bandwidth. Using these two conditions, the present invention selects only a finite number of Fourier series terms to approximate v(t) while maintaining the necessary accuracy. Thus:

$$v(t) = \sum_{k_1=-K_1}^{K_1} \ldots \sum_{k_s=-K_s}^{K_s} \sum_{k_c=-\infty}^{\infty} V(k_1, \ldots, k_s, k_c) \times e^{-j2\pi k_1 f_1 t} \ldots e^{-j2\pi k_c f_c t} \quad (3)$$

where $V(k_1, \ldots, k_s, k_c) \in C^N$. (An interesting property of the MFT algorithm is that it is not necessary to truncate to a finite number of harmonics of $f_c$.)

Assume that v(t) is sampled at a discrete set of points $t'_n = t_0 + nT_c$, where $T_c = 1/f_c$ is the clock period, $t_0 \in [0, T_c)$ and n runs over the integers, to obtain a discrete signal $\bar{v}(t')$. Since $$\bar{v}(t'_n) = \sum_{k_1=-K_1}^{K_1} \ldots \sum_{k_s=-K_s}^{K_s} \bar{v}(k_1, \ldots, k_s) \times e^{-j2\pi k_1 f_1 t_n} \ldots e^{-j2\pi k_s f_s t_n} \quad (4)$$

where $$\bar{v}(k_1, \ldots, k_S) = \sum_{k_1=-K_1}^{\infty} \bar{V}(k_1, \ldots, k_s, k_c) \times e^{-j2\pi k_c f_c t_0}, \quad (5)$$

the "envelope" v(t') is S-quasiperiodic and can be represented as a Fourier series in only the "information" fundamentals. The clock fundamental has disappeared, thereby forming an envelope.

Figure 2:
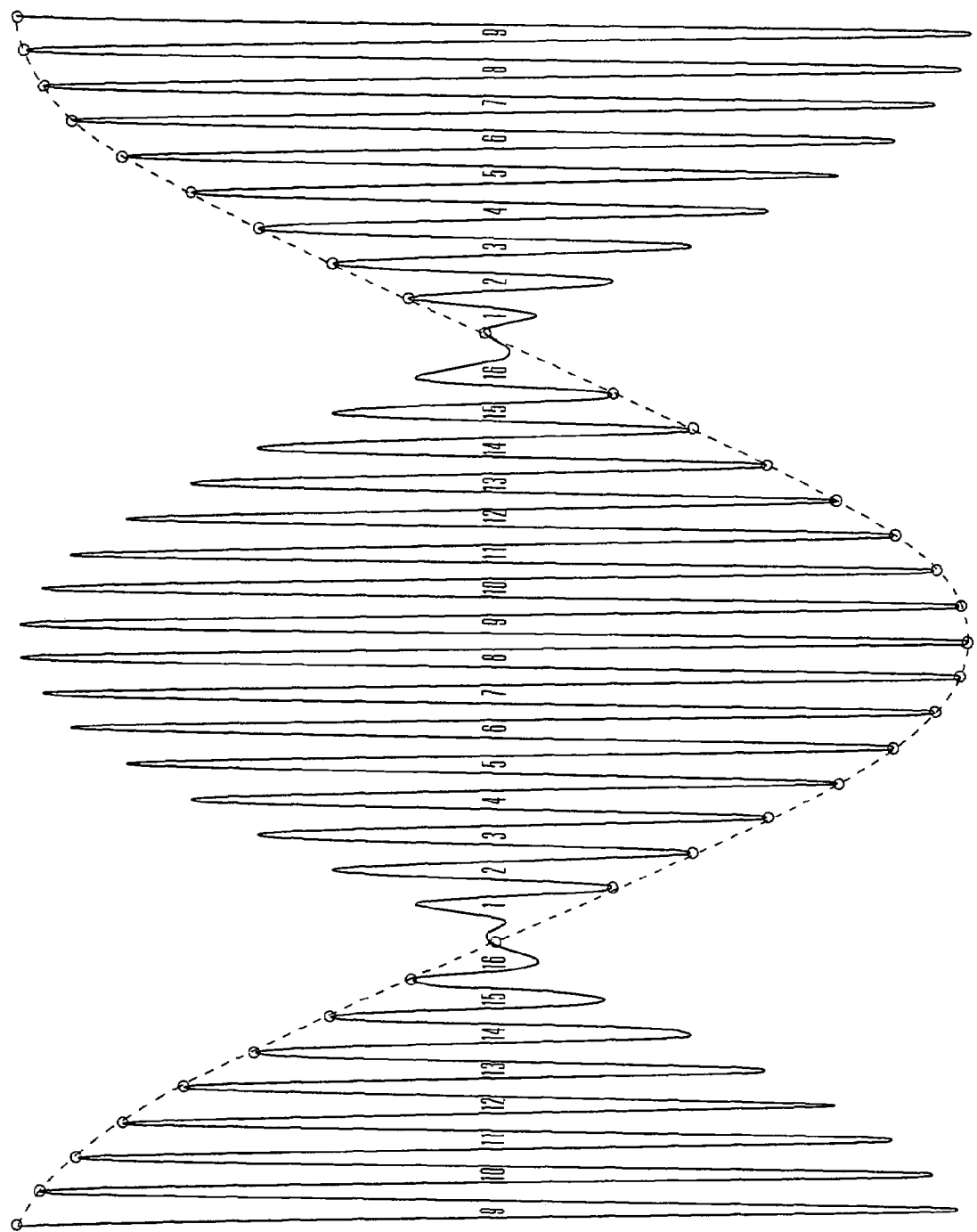
FIG. 2 shows an exemplary envelope in response to two inputs shown in FIG. 1.

FIG. 2 shows an exemplary envelop in response to the signals at input 104.1 (assuming that the inputs at 104.2, ..., 104.S are zero inputs) and input 106. In FIG. 2, the hollow, circular dots represent samples (or distinct points), while the continuous waveform (dashed line) is the waveform having $\bar{V}$ as its Fourier coefficients, or equivalently, obtained by Fourier interpolation of the sample points.

In principle, because there are only $$K = \prod_{s=1}^{s}(2K_s + 1)$$

Fourier coefficients to represent $\bar{v}$, once the value of K distinct points $t_1, \ldots, t_k$ along the sample envelope are known, then the full envelope can be recovered. The envelope corresponding to the quasiperiodic operating point is obtained by obtaining K sample points that lie on the solution to the DAE given by equation (1).

Figure 3:
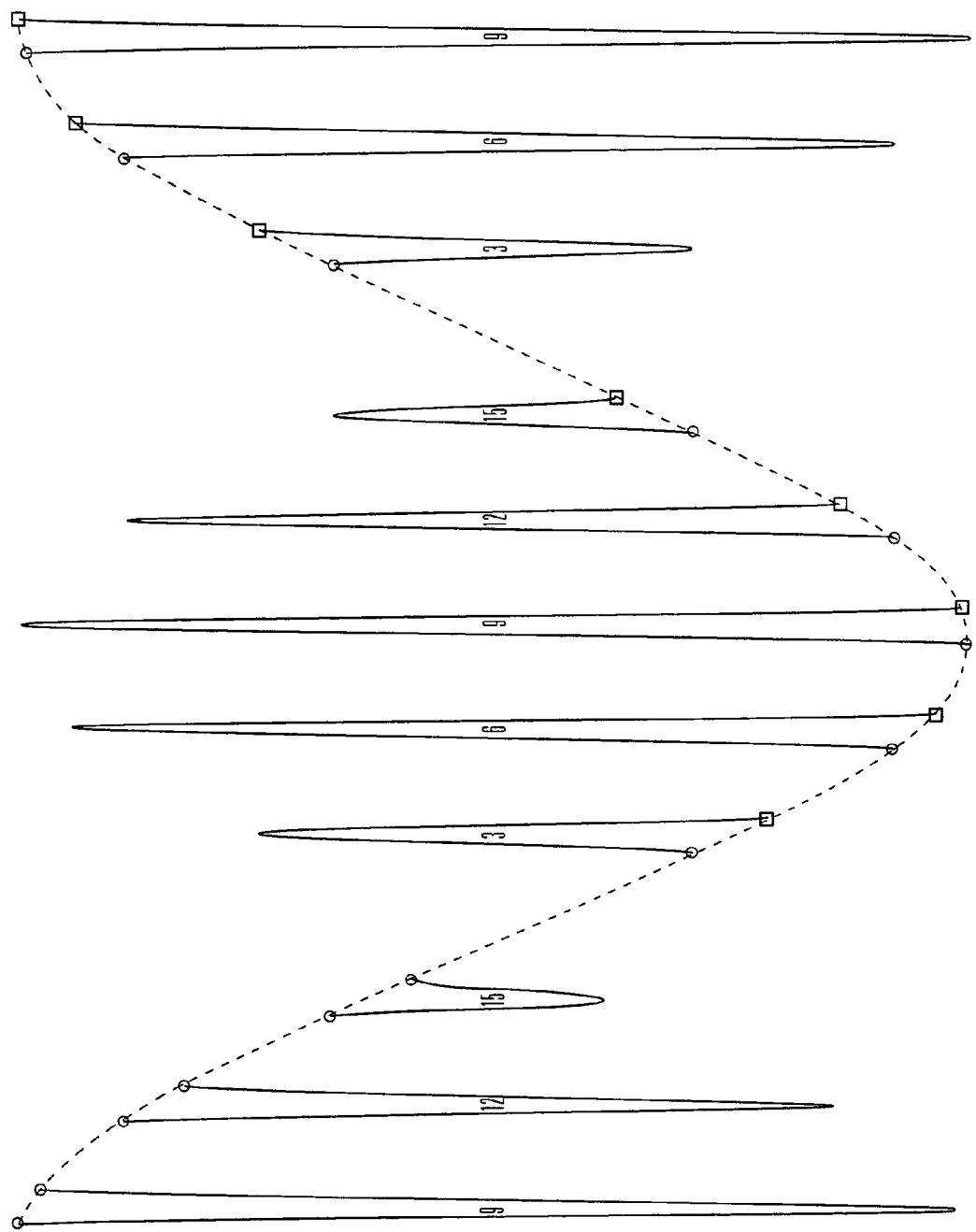
FIG. 3 shows a scheme of selecting K (K=2) sample points along the sample envelope shown in FIG. 2 to obtain five distinct time points, in accordance with the present invention.

FIG. 3 shows a particular scheme of selecting K (K=2) sample points along the sample envelope shown in FIG. 3 to obtain five distinct points (or distinct time points) [5=(K×2)+1], in accordance with the present invention. In FIG. 3, the distinct points are denoted by circles, and the reference points (reference time points) are denoted by squares.

Lets us define the state transition function $\phi(v_0, t_k, t_f) = v(t_f) = v(t): v(t)$ that satisfies equation (1) for $t \in [t_k, t_f]$ and $v(t_k) = v_0$. In particular, define the vector $$\bar{v}_0 = [\bar{v}^T(t_1), \ldots, \bar{v}^T(t_K)]^T = [v^T(t_1), \ldots, v^T(t_K)]^T, \quad (6)$$

where superscript T denotes matrix transpose, to contain $\bar{v}$ at the K sample points $t_k = t_0 + n_k T_c$, $k = 1 \ldots K$, $n_k \in \mathbb{Z}$. The value of the K points that follow by one cycle can be obtained from the transition function, $$\bar{v}_{T_c}^T = [v^T(t_1 + T_c), \ldots, v^T(t_K + T_c)]^T = \quad (7)$$
$$[\phi(v(t_1), t_1, t_1 + T_c)^T, \ldots, \phi(v(t_K), t_K, t_K + T_c)^T]^T$$

which may be written more compactly by introducing the multi-cycle transition function that is the collection of the K transition functions from $t_k$ to $t_k + T_c$, as $$\bar{v}_{T_c} = \Phi_{TT_c}(\bar{v}_0). \quad (8)$$

Note that for each mode n, the vector of signals on that node, at the sample time plus one clock cycle, $$\bar{v}_T^n,$$

is a delayed version of the signals at the sample points (this will be discussed in greater detail below). there exists, therefore, a linear operator $D_{T_c}$ that maps $$\bar{v}_0^n \text{ to } \bar{v}_{T_c}^n$$

$$\bar{v}_{T_c}^n = D_{T_c} \bar{v}_0^n. \quad (9)$$

Note that $D_{T_c}$ is a real matrix and independent of node n. Hence equation (9) holds for each $n = 1, \ldots, N$, and represents a boundary condition on a solution to (1).

Combining equations (8) and (9) gives $$(D_{T_c} \hat{x} I_N) \bar{v}_0 - \Phi_{T_c}(\bar{v}_0) = 0, \quad (10)$$

where $\hat{x}$ is the Kronecker product[1] and $I_N$ is the N by N identity matrix. Equation (10) is a system of KN nonlinear equations and KN unknowns that can be solved for the envelope sample points. From these sample points and the transition functions, the circuit's quasiperiodic operating point (in particular, the spectrum of v) can be recovered.

2. Sample Point Selection

To contruct the matrix $D_{T_c}$, referred to as the delay matrix, consider the Fourier series of $\bar{v}_0$ and $\bar{v}_{T_c}$. Referring to equation (4), equation (11) holds $$\bar{v}(t_n' + T_c) = \sum_{k_1 = -K_1}^{K_1} \ldots \quad (11)$$

-continued
$$\sum_{k_S = -K_S}^{K_S} \bar{V}(k_1, \ldots, k_S) e^{-j2\pi k_1 f_1 t_n'} \ldots e^{-j2\pi k_S f_S t_n'} \Omega_{T_c}(k_1, \ldots, k_S)$$

where $$\Omega_{T_c}(k_1, \ldots, k_s) = e^{-j2\pi k_1 f_1 T_c} \ldots e^{-j2\pi k_S f_S T_c} \quad (12)$$

Thus if $\Gamma$ is the matrix mapping sample points on the envelope to Fourier coefficients, then the delay matrix may be constructed as $$D_{T_c} = \Gamma^{-1} \Omega_{T_c} \Gamma. \quad (13)$$

In particular $\Gamma$ may be constructed as the Kronecker product of one-dimensional $(2K_s+1)$-point Fourier-transform matrices $$\Gamma_{mn}^{(s)} = e^{j2\pi m f_s t_n/(2K_s+1)} \quad (14)$$

as $$\Gamma = \Gamma^{(1)} \hat{x} \ldots \hat{x} \Gamma^{(S)} \quad (15)$$

From the properties of Kronecker products, $\Gamma^{-1}$ is likewise a Kronecker product of the inverses of the $\Gamma^{(s)}$. In the existing MFT algorithms, no particular consideration was given to the choice of the sample points $t_k$, so that the $\Gamma^{(s)}$'s there are ill-conditioned matrices corresponding to an "almost-periodic" Fourier transform. By contrast, the improved MFT algorithm of the present invention performs a process of choosing well-conditioned sample points.

Assume the K sample points can be arranged into an S-dimensional array $\tau(k_1, \ldots, k_S)$, $-K_s \leq k_s \leq K_s$, $1 \leq s \leq S$, such that for a given dimension s, there exists an integer p, and $$\tau(\ldots, k_s + 1, \ldots) - \tau(\ldots, k_s, \ldots) = \frac{T_s}{2K_s + 1} + pT_s \quad (16)$$

holds. In this case, the entries of the $\Gamma^{(s)}$ matrices are:

$$\Gamma_{mn}^{(s)} = e^{j2\pi mn/(2K_s+1)} \quad (17)$$

That is, they are the DFT matrices, and the matrix $\Gamma: C^{2K_1+1} \times \ldots \times C^{2K_s+1} \Rightarrow C^{2K_1+1} \times \ldots \times C^{2K_s-1}$ represents an S-dimensional DFT. Thus $\Gamma$ has a condition number of one; it is perfectly well-conditioned.

3. Matrix-Implicit Solution Procedure

The Newton's method can now be employed to solve $$(D_{T_c} \hat{x} I_N) \bar{v}_0 - \Phi_{T_c}(\bar{v}_0) = 0, \quad (18)$$

At iteration i, the Jacobian matrix is given by $$\bar{v}_0 - \frac{\partial \Phi}{\partial \bar{v}_0}\bigg|_{\bar{v}_0 = \bar{v}_0^i}, \quad (19)$$

Recall from (13) $D_{T_c} = \Gamma^{-1} \Omega_{T_c}$, which is fixed through all Newton iterations. Let $$J = \frac{\partial \phi}{\partial \overline{v}_0}\bigg|_{\overline{v}_0 = \overline{v}_0^i}$$

be obtained from the multicycle transition function by $$\frac{\partial \Phi}{\partial \overline{v}_0}\bigg|_{\overline{v}_0 = \overline{v}_0^i} = \begin{bmatrix} \frac{\partial \phi_1}{\partial \overline{v}_0(t_1)}\bigg|_{v_0(t_1) = v_0(t_1)^i} & & \\ & \ddots & \\ & & \frac{\partial \phi_K}{\partial \overline{v}_0(t_K)}\bigg|_{v_0(t_K) = v_0(t_K)^i} \end{bmatrix} \quad (20)$$

Note that J is block-diagonal. Defining $$b = -(D_{T_c} \otimes I_N)\overline{v}_0^i - \phi(\overline{v}_0^i),$$

the Newton iteration is performed by solving the equation $$((D_{T_c} \otimes I_N) - J)\Delta(\overline{v}_0^i) = b, \quad (21)$$

using an iterative Generalized Minimal Residual (GMRES) solver, and setting $$\overline{v}_0^{i+1} = \overline{v}_0^i + \Delta \overline{v}_0^i. \quad (22)$$

Each iteration of GMRES requires a matrix-vector multiplication. For a vector $q \in \mathfrak{R}^{KN}$, the term $(D_{T_c} \otimes I_N)q$ is calculated by first applying a K dimensional DFT N times, then scaling each row with $\Omega_{T_c}$, and finally applying a K dimensional inverse DFT N times.

Let q be partitioned into $q = [q_1^T, \ldots, q_K^T]^T, q_k \in \mathfrak{R}^N$, for $1 \leq k \leq K$. Then $$\frac{\partial \Phi}{\partial \overline{v}} q = \begin{bmatrix} \frac{\partial \phi_1}{\partial \overline{v}_0(t_1)} q_1 \\ \vdots \\ \frac{\partial \phi_K}{\partial \overline{v}_0(t_K)} q_K \end{bmatrix}. \quad (23)$$

The calculation of each $$\frac{\partial \phi_k}{\partial \overline{v}_0(t_k)} q_k$$

can be carried through matrix-vector multiplication and back-solving without explicitly forming the $$\frac{\partial \phi_k}{\partial \overline{v}_0(t_k)} q_k$$

matrix.

4. Preconditioning

For many problems, the GMRES algorithm is not efficient for solving equation (21) without an effective preconditioner. To analyze the reason, consider the case where the state transition function of the circuit, over one clock cycle, is approximately linear, that is $\phi(\chi,t,t+T_c) \simeq H\chi(t)$. Linear circuits are an obvious example of a case where this is true, and while nonlinear circuits will have nonlinear state-transition functions, if the method performs poorly for linear circuits it surely will not work well for nonlinear circuits either. However, many nonlinear circuits have a state-transition function that is nearly linear, a fact which is exploited below to construct an effective preconditioner. The convergence of the GMRES method will depend on the location of the eigenvalues of the Jacobian matrix, $D_{T_c} - J$. If $\lambda_H$ is an eigenvalue of the matrix H, then $e^{i\omega t_c} - \lambda_H$, where $\omega = 2\pi(k_1 f_1 + k_2 f_2 + \ldots k_s f_s)$ will be an eigenvalue of $D_{T_c} - J$, for every $k_1, k_2, \ldots$ in the MFT analysis. Thus unless all the secondary input frequencies are nearly commensurate with the clock frequency, the eigenvalues of $D_{T_c} - J$ will be "fanned out" by delay matrix. This will cause severe convergence problems for the GMRES solver. Roughly speaking, the GMRES algorithm in the MFT algorithm with K total harmonics will take K times as many iterations to coverage than the GMRES iteration for the steady-state problem with only the clock excitation applied. This follows because the eigenvalues of H are typically inside the unit circle of the complex plane. The delay matrix replicates the eigenvalue structure K times, each shift being a complex number of order unity, and generally causing the convex hull of the eigenvalues of $D_{T_c} - J$ to enclose the origin.

The following lemmas about the properties of Kronecker products are needed to perform the formal analysis.

Lemma 5.1

If $A_1, A_2, \ldots, A_p \in F^{m \times m}, B_1, B_2, \ldots, B_p \in F^{n \times n}$ then
$A_1 A_2 \ldots A_p \otimes (B_1 B_2 \ldots B_p) = (A_1 \otimes B_1)(A_2 \otimes B_2) \ldots (A_p \otimes B_p)$.

Lemma 5.2

If $A \in F^{m \times m}, B \in F^{n \times n}$ then
(a) $(A \otimes I_n)(I_m \otimes B) = (I_m \otimes B)(A \otimes I_n)$.
(b) $(A \otimes B)^{-1} = (A^{-1} \otimes B^{-1})$.

Theorem 5.3

If $\lambda_H$ is an eigenvalue of $\partial \Phi / \partial \overline{v}_0$, then $e^{j2\pi \omega_k T_c}$ is an eigenvalue of the MFT Jacobian matrix.

The proof is as follows. For linear circuits, the diagonal blocks of $$\frac{\partial \Phi}{\partial \overline{v}_0}$$

are the same, i.e., $$\frac{\partial \phi_K}{\partial \overline{v}_0(t_1)}.$$

Denote a diagonal block as H, then the Jacobian matrix is equal to $$(\Gamma^{-1}\Omega_{T_c}\Gamma) \otimes I_N - (I_K \otimes H) \qquad (24)$$

$$= (\Gamma^{-1} \otimes I_N)(\Omega_{T_c} \otimes I_N)(\Gamma \otimes I_N) - (I_K \otimes H) \qquad (25)$$

$$= (\Gamma^{-1} \otimes I_N)\{(\Omega_{T_c} \otimes I_N) - (\Gamma^{-1} \otimes I_N)^{-1}(I_K \otimes H)(\Gamma \otimes I_N)^{-1}\}(\Gamma \otimes I_N) \qquad (26)$$

$$= (\Gamma^{-1} \otimes I_N)\{(\Omega_{T_c} \otimes I_N) - (\Gamma \otimes I_N)(I_K \otimes H)(\Gamma \otimes I_N)^{-1}\}(\Gamma \otimes I_N) \qquad (27)$$

$$= (\Gamma^{-1} \otimes I_N)\{(\Omega_{T_c} \otimes I_N) - (I_K \otimes H)(\Gamma \otimes I_N)(\Gamma \otimes I_N)^{-1}\}(\Gamma \otimes I_N) \qquad (28)$$

$$= (\Gamma^{-1} \otimes I_N)\{(\Omega_{T_c} \otimes I_N) - (I_K \otimes H)\}(\Gamma \otimes I_N). \qquad (29)$$

Equation (24) to equation (25) holds because of $I_N = I_N I_N I_N$ and Lemma 1. Equation (26) to equation (27) holds due to Lemma 2(b), and equation (27) to equation (28) holds due to Lemma 5.2(a). Since $(\Gamma^{-1} \otimes I_N)$ is unitary and its inverse is $(\Gamma \otimes I_N)^{-1}$, the right hand side of equation (29) has the same spectrum as $(\Omega_{T_c} \otimes I_N)-(I_K \otimes H)$. It is easy to verify that $(\Omega_{T_c} \otimes I_N)-(I_K \otimes H)$ is block diagonal, hence its eigenvalues are the union of eigenvalues of all the blocks, $e^{j2\pi\omega_k T_c} I_N - H$, for $k=1,\ldots,K$.

The preceding analysis suggests a good way of preconditioning for solving the Newton equation (21). Solving equation (21) is equivalent to solving $$\{\Omega_{T_c} - ((\Gamma \otimes I_N)J\Phi(\Gamma^{-1} \otimes I_N))\}\gamma = \Gamma b, \qquad (30)$$

where $\gamma = \Gamma\Delta\overline{v}^i$. A good choice of preconditioner is $P=(\Omega_{T_c} \otimes I_N)-(I_K \otimes H)$ where H can be chosen as the Jacobian matrix from the steady-state analysis in the initial guess stage discussed in Section 5, or any of the diagonal blocks $$\frac{\partial \phi}{\partial v(t_i)},$$

for $i=1,\ldots K$, of $$\frac{\partial \phi}{\partial \overline{v}_0}.$$

In particular, if the signal-cycle state-transition function is linear and time invariant, then the Newton equation can be solved in a single GMRES iteration. Note that the preconditioner presented here is effective if the Jacobian of the state-transition function is nearly constant over multiple cycles. The circuit behavior inside each clock cycle is hidden from the preconditioner. This is not the case in, for example, the time- or frequency-averaged preconditioners typically used in modern harmonic balance codes. For this reason the preconditioner presented here may perform well under much weaker assumptions about the circuit behavior, in particular at higher power levels.

For each GMRES iteration, a system $Pu=v$ has to be solved. Since P is block diagonal, it needs to solve a sequence of K systems $(e^{j2\pi\omega_k T_c} I_N - H)u_k = v_k$, for $k=1,\ldots,K$, where $u^T = [u_1^T, \ldots, u_K^T]^T$ and $v^T = [v_1^T, \ldots, v_K^T]^T$. The preconditioner can be applied very efficiently by incorporating a Krylov subspace reuse algorithm, as the linear system to be solved are the same as arise in the small-signal analysis for periodic time-varying systems. The basic idea of the algorithm is that the Krylov subspaces associated with the matrices $e^{j\omega T_c}-H$ are very similar for different $\omega_k$. Essentially, the Krylov-subspace re-use algorithm allows the preconditioner for the matrix $(D_{T_c} \otimes I_N)-J$ to be applied with only slightly more cost than an iterative solve with the matrix H.

Figure 4:
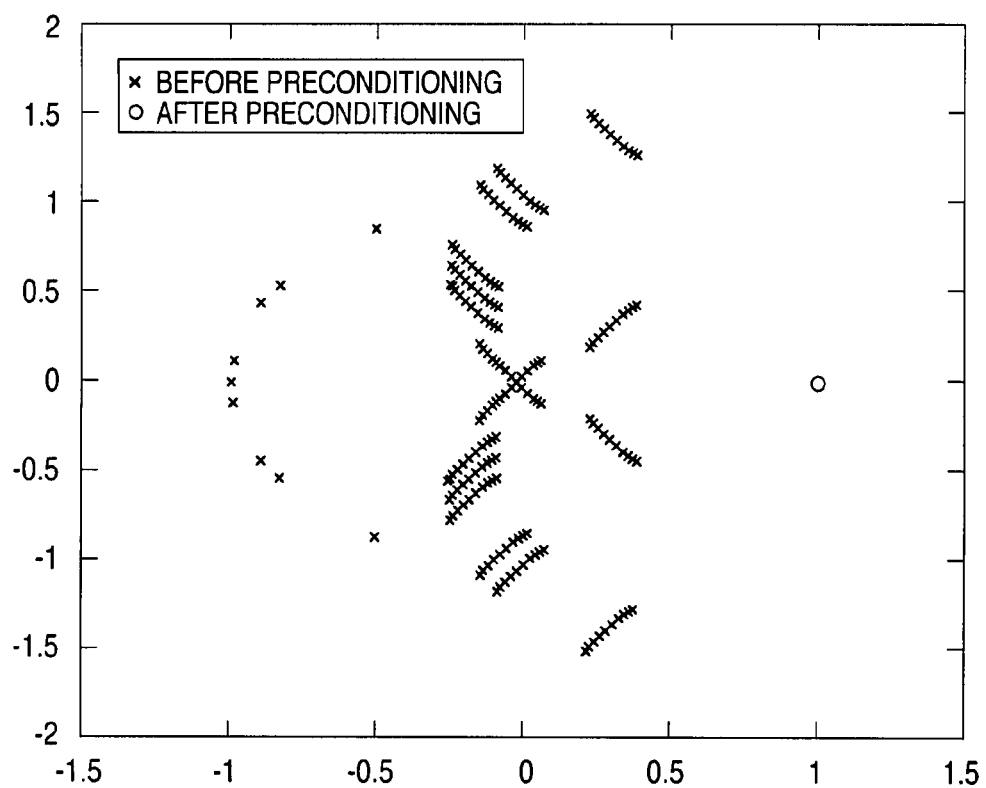
FIG. 4 shows the effectiveness of the preconditioning process in compressing the eigenvalues for an RF receiver circuit, in accordance with the present invention.

FIG. 4 shows the effectiveness of the preconditioning process in compressing the eigenvalues for an RF receiver circuit. Specifically, FIG. 4 shows eigenvalue distribution before and after the preconditioning process. In FIG. 4, the eigenvalues are very tightly clustered around unity, indicating excellent performance of the preconditioner and very rapid GMRES convergence.

Figure 5:
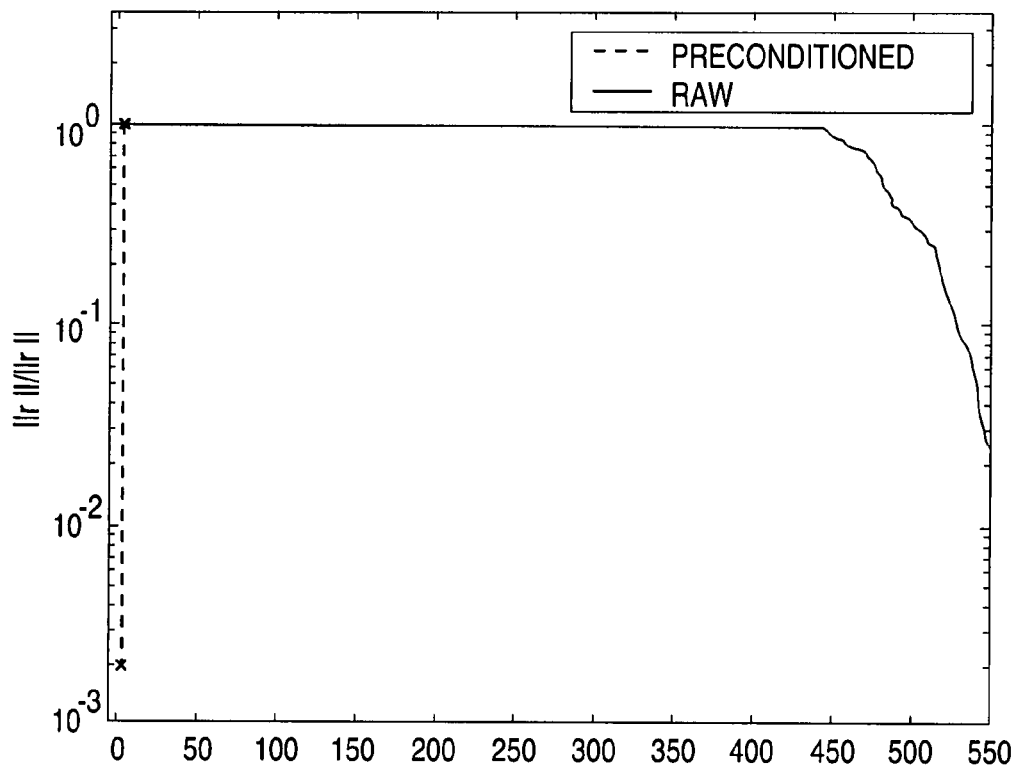
FIG. 5 shows the effectiveness of the preconditioning process in reducing the number of iterations needed to solve each MFT Newton update equation, in accordance with the present invention.

FIG. 5 shows the effectiveness of the preconditioning process in reducing the number of GMRES iterations needed to solve each MT Newton update equation, for the same RF circuit mentioned above. Only three iterations are needed to reduce the residual by a factor of $10^{-2}$, whereas without the preconditioning process, over 400 iterations are needed to achieve any reduction in the residual at all. Since the MFT circuit equations are not solved exactly, on average there is a performance advantage in the MFT method to using approximate solves of the Newton update equation, and therefore GMRES is converged to a relatively loose tolerance.

5. Improving Newton Convergence

Rapid convergence of Newton's method can only be assured with a good initial estimation. To achieve a good initial estimation, the present invention first calculates the periodic steady state response of the circuit with the clock signal applied, while suppressing other non-DC signals. Using the steady state solution as an operating point, a small-signal analysis is performed by treating non-clock fundamentals as small signals. As a result of the small signal analysis, amplitudes at $f_s+k_s f_c$, for $-K_s \leq \kappa_s \leq K_s$, $1 \leq s \leq S$, are generated. These amplitudes are transformed into time domain initial conditions via inverse multidimensional discrete Fourier transform (DFT). At higher input power levels, using a Newton continuation method, with the amplitude of the non-clock signals as the continuation parameter, is generally effective in securing convergence.

6. Spectrum Calculation

After the solution is converged, the values $\overline{v}=[v(t_1)^T, v(t_2)^T, \ldots, v(t_K)^T]^T$ and the integration solution in $\overline{v}=[v(t_1)^T, v(t_2)^T, \ldots, v(t_K)^T]^T$ are available. From these pieces of information, the spectrum $v(t)$ can be obtained. Let $$v(t) = \sum_{k_c=-K_c}^{K_c} \sum_{k_1=-K_1}^{K_1} \ldots \sum_{k_S=-K_S}^{K_S} V(k_1, \ldots, k_S, k_c) \times \qquad (31)$$

$$e^{-j2\pi k_1 f_1 t} \ldots e^{-j2\pi k_S f_S t} e^{-j2\pi k_c f_c t}.$$

Define $\bar{v}(\tau)=[v(t_1+\tau)^T, v(t_2+\tau)^T, \ldots, v(t_K+\tau)^T]^T$. Then $$\bar{v}(\tau) = \{(\Gamma^{-1}\Omega(\tau))\otimes I_N\}\times \begin{bmatrix} \vdots \\ \sum_{k_c}^{K_c} = -K_c V(k_1,\ldots,k_S,k_c)e^{-j2\pi k_c f_c \tau} \\ \vdots \end{bmatrix}. \quad (32)$$

Then for each K N-vector $V(\cdot,k_c)$ where $-K_c \leq k_c \leq K_c$ which is collection of all N-vectors $V(k_1,\ldots,k_S,k_c)$, where $-K_1 \leq k_1 \leq K_1, \ldots, -K_s \leq k_s \leq K_s$ (the actual order is determined by the Fourier transform), $$v(\cdot,k_c) = \frac{1}{T_c}\int_0^{T_c} \{(\Omega(\tau)^{-1}\Gamma)\otimes I_N\}\bar{v}(\tau)e^{j2\pi k_c f_c \tau} d\tau \quad (33)$$

Forming $\{(\Omega(T)^{-1}\Gamma)\otimes I_N\}\bar{v}(\tau)$ requires the values for $v(t_1+\tau), \ldots, v(t_k+\tau)$, or synchronized time steps between cycles. The total computational costs is one KN-vector integration and M Fourier transforms, where M is the number of synchronized time points.

The synchronized time step requirement may not be easily met in practice. One alternative is to use interpolation schemes. However, these schemes potentially lose accuracy. Another alternative is to utilize integration instead of multidimensional discrete Fourier transforms. Specifically, it is easy to verify that $$V(k_1,\ldots,k_S,k_c) = \frac{1}{T_c}\int_0^{T_c} E_p^T\{(\Omega(\tau)^{-1}\Gamma)\otimes I_N\}\bar{v}(\tau)e^{j2\pi k_c f_c \tau}d\tau = \quad (34)$$

$$E_p^T(\Gamma\otimes I_N)\left(\frac{1}{T_c}\int_0^{T_c} \bar{v}(\tau)e^{j2\pi(\Sigma_{i=1}^S k_i f_i)\tau}e^{j2\pi k_c f_c \tau}d\tau\right),$$

where $E_p$ is a KN×N block matrix whose pth N χ N block is $I_N$ and other blocks zero, and p is determined by $(k_1,\ldots,k_S)$ from the Fourier transform. Calculating equation (34) does not require synchronized time points. The total cost of calculating $V(\cdot,k_c)$ is K KN-vector integrations plus one final Fourier transform. However, it might be more expensive since integrations normally cost more than Fourier transforms.

7. Simulation Utilizing A Preferred Embodiment Of MFT Method

The first example is a low-pass switched-capacitor filter of 4 kHz bandwidth and having 238 nodes, resulting in 337 equations. To analyze this circuit, the improved MFT of the present invention analysis was performed with an 8-phase 100 kHz clock and a 1V sinusoidal input at 100 Hz.

Figure 6:
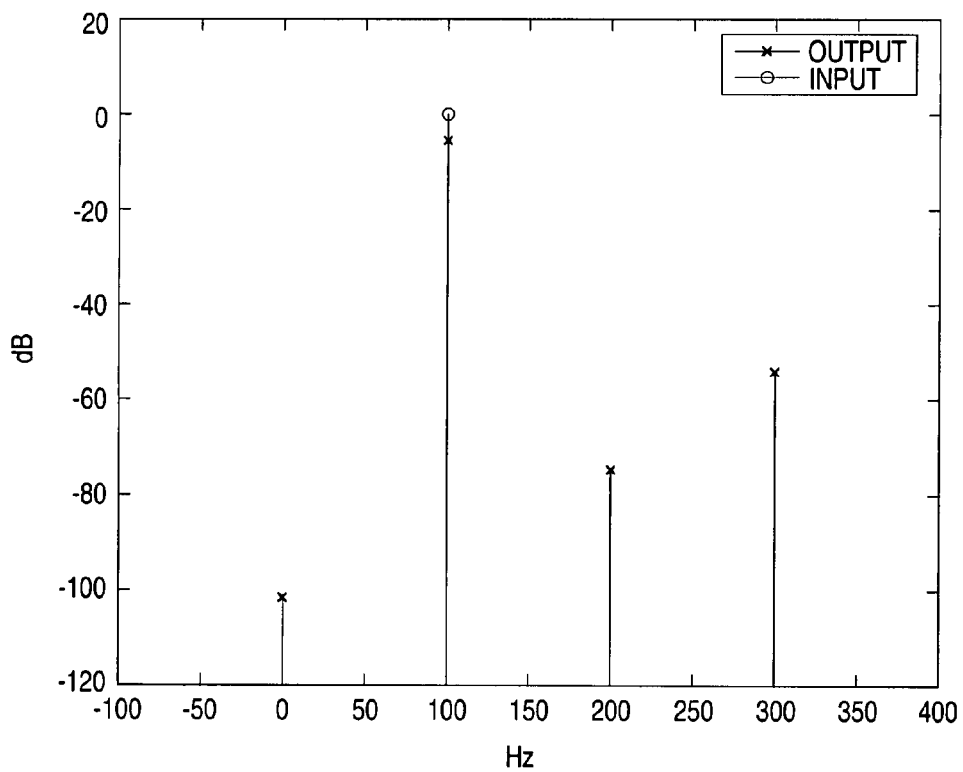
FIG. 6 shows a simulation result for a filter circuit in accordance with the present invention.

The 1000 to 1 clock to signal ratio makes this circuit difficult for traditional circuit simulators to analyze. In the improved MFT method, three harmonics were used to model the input signal. The eight-phase clock resulted in the need to use about 1250 timepoints in each transient integration. This brings the total number of variables solved by the analysis to slightly less than three million (337×(2×3+1)×1250=2,948,750). The simulation took a little less than 20 minutes CPU time to finish, on a Sun UltraSparc1 workstation with 128 Megabyte memory and a 167 MHz CPU clock. FIG. 6 shows the output spectrum of the filter.

The second example is a high-performance image rejection receiver. It consists of a low-noise amplifier, a splitting network, two double-balanced mixers, and two broadband Hilbert transform output filters combined with a summing network that is used to suppress the undesired side-band. A limiter in the LO path is used for controlling the amplitude of the LO. It is a rather large RF circuit that contains 167 bipolar transistors and uses 378 nodes. This circuit generates 987 equations in the simulator.

Figure 7:
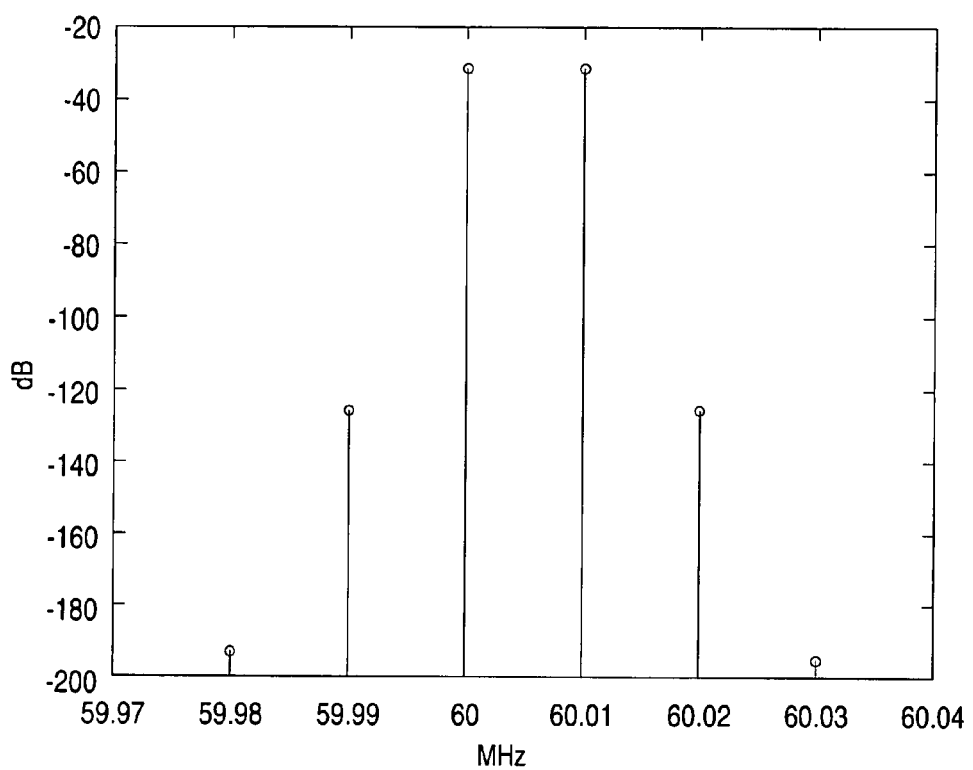
FIG. 7 shows the intermodulation distortion of a high-performance receiver.

To determine the intermodulation distortion characteristics, the circuit was driven by a 780 MHz LO and two 50 mV closely placed RF inputs, at 840 MHz and 840 MHz+10 KHz, respectively. Three harmonics were used to model each of the RF signals. 200 time points were used in each transient clock-cycle integration, considered to be conservative in terms of accuracy for this circuit. As a result, nearly ten million unknowns (987×(2×3+1)$^2$×200=9,672,600) were generated. It took 55 CPU minutes to finish on a Sun UltraSpare10 workstation with 128 Megabytes of physical memory and a 300 MHz CPU clock. FIG. 7 shows 3rd and 5th order distortion products.

To understand the efficiency of the improved MFT method of the present invention, consider that traditional transient analysis would need at least 80,000 cycles of the LO to compute the distortion, a simulation time of over two days. In contrast, the MFT method of the present invention is able to resolve very small signal levels, such as the 5th order distortion products show in FIG. 7.

Solving the MFT equations by direct factorization methods is also impractical, as the storage needed for the factored rank—50,000(987×(2×3+1)$^2$=48,363) MFT Jacobian of Equation 19 is several gigabytes. Forming the Jacobian matrix by direct methods would also require computation time proportional to the cost of 50,000 transient integration cycles, again a number on the order of days.

Figure 8:
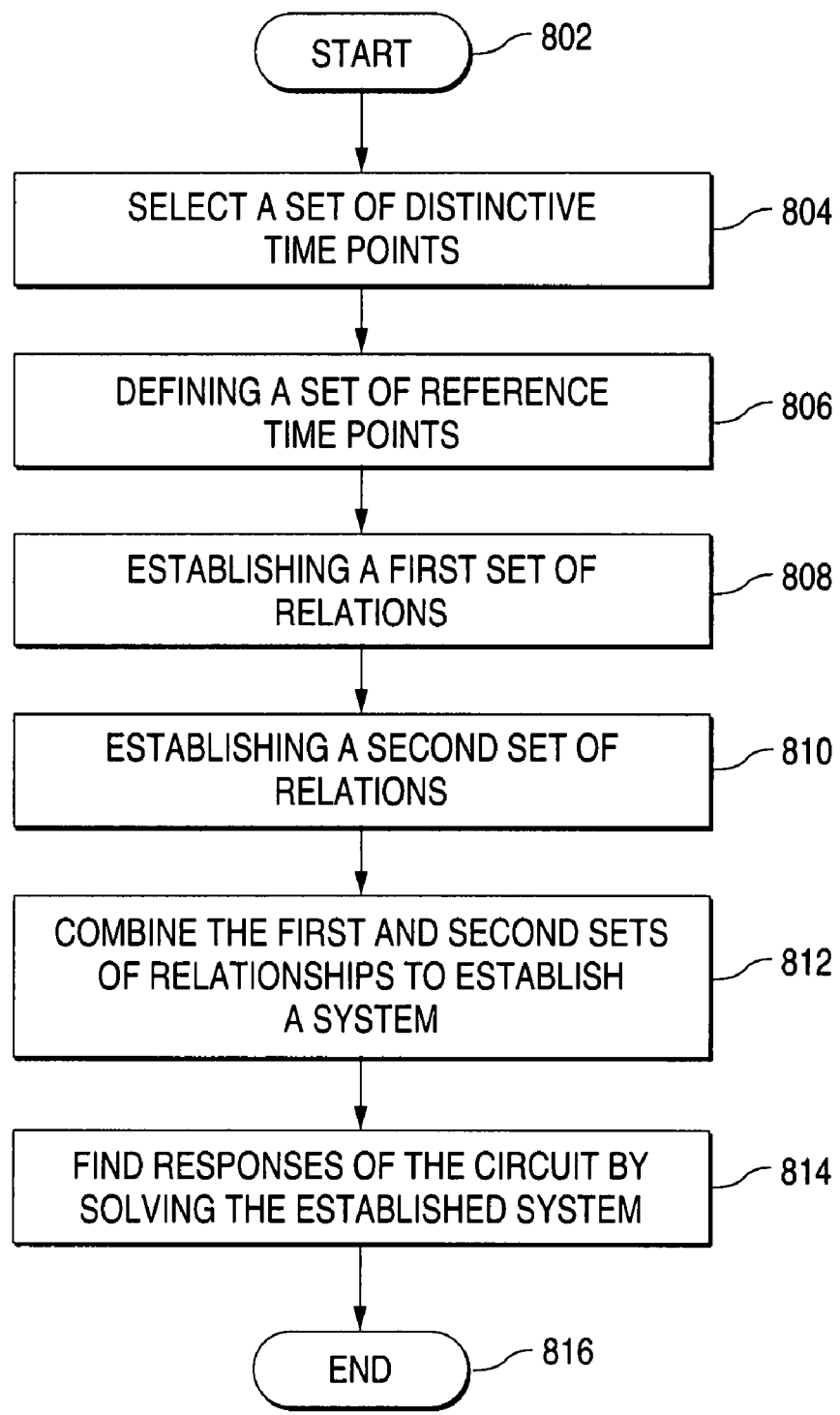
FIG. 8 shows a flowchart illustrating a process simulating the responses of a circuit, in accordance with the present invention.

FIG. 8 shows a flowchart illustrating a process of simulating the responses of a circuit such as the circuit shown in FIG. 1, in accordance with the a preferred embodiment of the present invention.

Step 804 selects a set of evenly spaced distinct time points shown as the circle dots in FIG. 3. The details of step 804 can be found in equation (16) and related descriptions.

Step 806 defines a set of reference time points shown as the square dots in FIG. 3. As shown in FIG. 3, each of the reference time points is associated with a respective distinct time point, and each of the reference time points is one signal period (or clock cycle) away from its respective distinct time point.

Step 808 establishes a first set of relationships between the values at the distinct time points and the values at the reference time points. The details of step 808 can be found in equation (8) and related descriptions.

Step 810 establishes a second set of relationships between the values at the distinct time points and the values at the reference time points. The details of step 810 can be found in equation (9) and related descriptions.

Step 812 combines the first and second sets of relationships to establish a system and equations that contain the values at the distinct time points only. The details of step 808 can be found in equations (10) and (18) and related descriptions.

Step 814 finds (or generates) the simulated responses of the circuit at the distinct time points by solving the established system of equations. If a circuit includes N internal circuit nodes and M outputs, step 814 can find (or generate) the simulated responses for all of the N internal circuit nodes and M outputs. The details of step 814 can be found in equations (18)-(22) and (30) and related descriptions.

Figure 9:
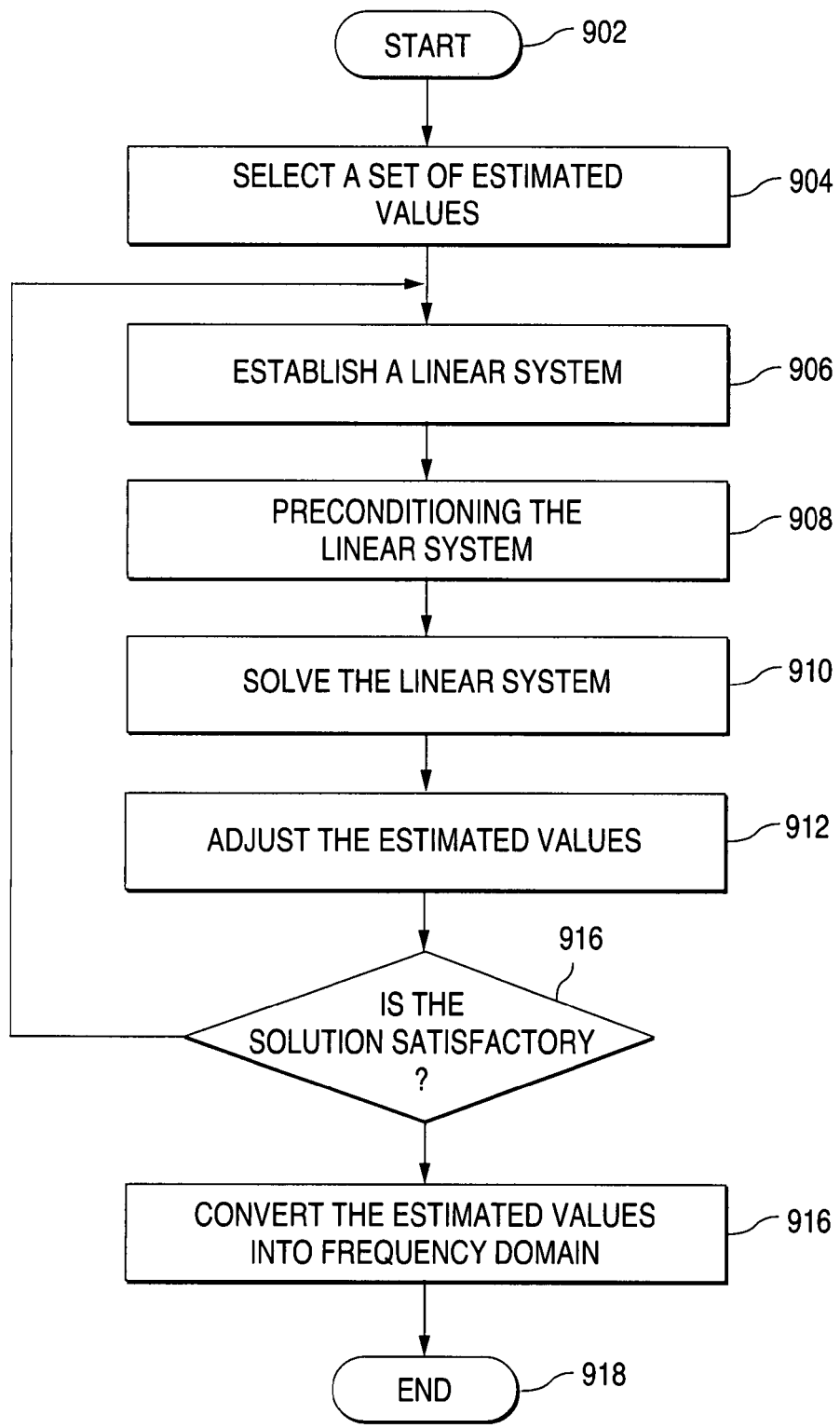
FIG. 9 shows a flowchart illustrating an exemplary process of solving the system of equations established in FIG. 9, in accordance with the present invention.

FIG. 9 shows a flowchart illustrating an exemplary process of solving the established system of equations in step 814 of FIG. 8, in accordance with the present invention.

Step 904 selects a set of estimated values to reflect estimated circuit responses at the distinct time points. The details of step 904 can be found in Section 5.

Step 906 establishes a system of linear equations at the estimated values. The details of step 906 can be found in equation (21) and related descriptions.

Step 908 preconditions the system of linear equations to improve the convergence of solution to the system of linear equations. The details of step 908 can be found Section 4.

Step 910 solves the system of linear equations to generate the correction values to adjust the estimated circuit responses at the distinct time points. The details of step 910 can be found in equations (21)-(22) and related descriptions.

Step 912 adjusts the estimated values as newly estimated values to reflect the estimated circuit responses at the distinct time points. The details of step 912 can be found in equations (21)-(22) and related descriptions.

Step 914 determines whether the adjusted estimated values have an acceptable accuracy to represent the circuit responses. If the determination is negative, the process is led to step 906. If the determination is positive, the process is led to step 916. The estimated values and adjusted estimated values are in time domain.

Step 916 converts the estimated values from time domain to frequency domain. The details of step 916 can be found in Section 6, equations (31)-(34).

8. Hardware Platform

Figure 10:
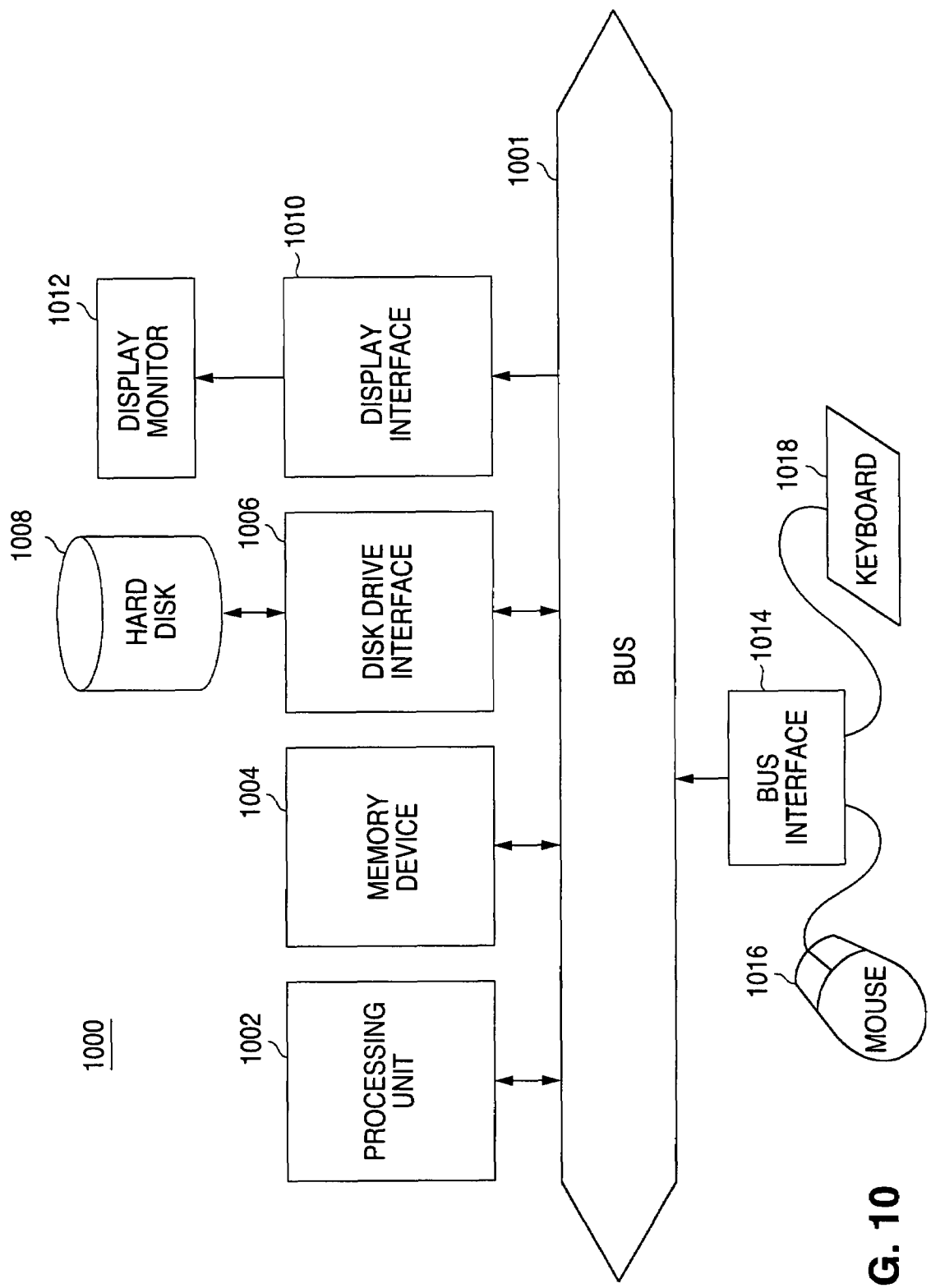
FIG. 10 shows a block diagram illustrating an exemplary computer system, which can be used as a hardware platform for executing the program that performs the processes shown in FIGS. 8 and 9, in accordance with the present invention.

FIG. 10 shows a block diagram illustrating an exemplary computer system 1000, which can be used as a hardware platform for executing the program that performs the processes shown in FIGS. 8 and 9.

As shown in FIG. 10, computer system 1000 includes system bus 1001, processing unit 1002, memory device 1004, disk drive interface 1006, hard disk 1008, display interface 1010, display monitor 1012, bus interface 1014, mouse 1016, keyboard 1018, and network communication interface 1020.

The hard disk 1008 is coupled to disk drive interface 1006; monitor display 1012 is coupled to display interface 1010; and mouse 1016 and keyboard 1018 are coupled to bus interface 1014. Coupled to system bus 1001 are processing unit 1002, memory device 1004, disk drive interface 1006, display interface 1010, and network communication interface 1020.

The memory device 1004 stores data and programs. Operating together with disk drive interface 1006, hard disk 1008 also stores data and programs. However, memory device 1004 has faster access speed than hard disk 1008, while hard disk 1008 has higher capacity than memory device 1004.

Operating together with the display interface 1010, display monitor 1012 provides visual interfaces between the programs being executed and users, and displays the outputs generated by the programs.

Operating together with bus interface 1014, mouse 1016 and keyboard 1018 provide inputs to computer system 1000.

The network communication interface 1020 provides an interface between computer system 1000 and network 104 in accordance with predetermined networking protocols.

The processing unit 1002, which may include more than one processor, controls the operations of computer system 1000 by executing the programs stored in memory device 1004 and hard disk 1008. The processing unit also controls the transmissions of data and programs between memory device 1004 and hard disk 1008.

In the present invention, the program for performing the steps shown in FIGS. 8 and 9 can be stored in memory device 1014 or hard disk 1018. The program can be executed by processing unit 1002.

9. Summary

The present invention improves the existing MFT method. The MFT method of the present invention is an efficient approach to analyzing multi-frequency nonlinear effects such as intermodulation distortion. Making the MFT method computationally efficient on problems of engineering interest required careful construction of the delay matrix, matrix-implicitly Krylov subspace iterative linear solvers, and a preconditioner tailored to the MFT method and the circuits it typically analyzes. As a result, nonlinear systems comprising tens of millions of unknowns can be solved in less than an hour with computational resources commonly available to engineering designers.

One salient advantage of the MFT method in the present invention is in computing the functions $\Phi$ and the product of the Jacobian of $\Phi$ with some vectors. Both computations are essentially the solution of an initial value problem. Each application of the operator $D_{T_c}-J$ or calculation of the Newton residual, involves solving K such initial value problems, that is, integrating K sets of DAEs forward in time over one clock period. Each of the K problems, however, is essentially decoupled. Parallel implementations of the MFT will therefore enjoy very efficient processor utilization. This decoupling also assists the implementation of out-of-core solvers. In fact, it has been observed it is possible to implement the MFT algorithm as an out-of-core algorithm with over 80% average CPU utilization.

While the invention has been illustrated and described in detail in the drawing and foregoing description, it should be understood that the invention may be implemented through alternative embodiments within the spirit of the present invention. Thus, the scope of the present invention is not intended to be limited to the illustration in this specification, but is to be defined by the appended claims.

What is claimed is:

1. A computer implemented method for simulating responses of an analog circuit using a mixed frequency time method, the circuit receiving a periodic sample signal and at least one information signal, the method comprising the steps of:

(a) selecting a set of evenly spaced distinct time points;
  (b) defining a set of reference time points, wherein each of the reference time points is associated with one of the distinct time points;
  (c) establishing a first set of relationships between values at the distinct time points and values at the reference time points, wherein the first set of relationships are defined by a first equation $$v^-_{T_c} = \Phi_{T_c}(v^-_0);$$

where $v^-_0$=vector of signals at distinct time points,
  $v^-_{T_c}$=vector of signals at reference time points,
  $\Phi_{T_c}$=multicycle transition function;
  (d) establishing a second set of relationships between the values at the distinct time points and the values at the reference time points, wherein the second set of relationships are by defined by a second equation $$v^{-n}_{T_c} = D_{T_c}(v^{-n}_0);$$

where $v^{-n}_0$=vector of signals at distinct time points, for boundary condition n, $v^{-n}{}_{T_c}$=vector of signals at reference time points, for boundary condition n, $D_{T_c}$=delay matrix;

(e) combining the first and the second sets of relationships to establish a system of equations in terms of the values at the distinct time points, wherein combining the first and the second sets of relationships comprises combining the first and second equations to produce a third equation $$(D_{T_c} \otimes I_n)\bar{v}_0 - \Phi_{T_c}(\bar{v}_0) = 0,$$

where $\otimes$ is a Kronecker product and $I_N$ is an N by N identity matrix; and (f) finding responses of the circuit at the distinct time points by solving the established system of equations, as defined by the third equation.

2. The method of claim 1, wherein each of the reference time points is one signal period away from its respective distinct time point.

3. The method of claim 1, wherein establishing the first set of relationships further comprises the steps of:

selecting a set of initial values at the distinct time points; and performing integration from the distinct time points to their respective reference time points to generate values between the distinct time points and the reference time points.

4. The method of claim 3 further comprising a step of saving to disk Jacobian matrices at integration time points.

5. The method of claim 3, wherein the values generated by the integration are in time domain, and wherein establishing the first set of relationships further comprises the step of:

generating values reflecting circuit responses in time domain based on the values generated by the integration.

6. The method of claim 1, wherein establishing the second set of relationships further comprises the steps of:

selecting a set of initial values at the distinct time points;

performing a forward multidimensional discrete Fourier transform on the initial values to transform the initial values from real values to complex values;

performing a phase shift of a sampling period on the complex values; and performing an inverse multidimensional discrete Fourier transform to convert the phase shifted complex values to real values.

7. The method of claim 1, wherein finding responses of the circuit at the distinct time points further comprises the step of:

solving the established system of equations by performing a discrete numeric solution method to generate the responses of the circuit at the distinct time points.

8. The method of claim 7 wherein the discrete numeric solution method is Newton method.

9. The method of claim 7, wherein the established system of equations in step (e) is a system of nonlinear equations, the discrete numeric solution method contains solution to a system of linear equations by applying matrix implicit iterative linear solvers to the linear equations, and wherein finding responses of the circuit at the distinct time points further comprises the steps of:

(g) selecting a set of estimated values to reflect estimated circuit responses at the distinct time points;

(h) establishing a system of linear equations at the estimated values;

(i) preconditioning the system of linear equations to improve convergence of solution to the system of linear equations; and (j) solving the system of linear equations to generate correction values to adjust the estimated values.

10. The method of claim 9, wherein preconditioning the system of linear equations comprises using a combination of a delay matrix and a linear model of a state transition function to construct a preconditioner.

11. The method of claim 9, further comprising the steps of:

(k) using the adjusted estimated values as newly estimated values to reflect estimated circuit response at the distinct time points; and (l) repeating steps (g)-(k) until the estimated values form a satisfactory solution to the system of equations established in step (e).

12. The method of claim 11, wherein the estimated values are in time domain, the method further comprising the step of:

(m) converting the estimated values into frequency domain.

13. The method of claim 1, wherein the values between which the first set of relationships was established and the values between which the second set of relationships was established are voltages at the distinct time points and reference time points.

14. An apparatus for simulating responses of an analog circuit using a mixed frequency time method, the circuit receiving a periodic sample signal and at least one information signal, the apparatus comprising:

a processing unit;

a memory storing a program of instructions; and a user interface;

wherein the program of instructions implements a method for simulating responses of an analog circuit, the programs of instructions comprising:

(a) means for selecting a set of evenly spaced distinct time points;

(b) means for defining a set of reference time points, wherein each of the reference time points is associated with one of the distinct time points;

(c) means for establishing a first set of relationships between values at the distinct time points and values at the reference time points, wherein the first set of relationships are defined by a first equation $$v^-_{T_c} = \Phi_{T_c}(v^-_0);$$

where $v^-_0$=vector of signals at distinct time points, $v^-_{T_c}$=vector of signals at reference time points, $\Phi_{T_c}$=multicycle transition function;

(d) means for establishing a second set of relationships between the values at the distinct time points and the values at the reference time points, wherein the second set of relationships are by defined by a second equation $$v^{-a}{}_{T_c} = D_{T_c}(v^{-a}{}_0);$$

where $v^{-n}{}_0$=vector of signals at distinct time points, for boundary condition n, $v^{-n}{}_{T_c}$=vector of signals at reference time points, for boundary condition n, $D_{T_c}$=delay matrix;

(e) means for combining the first and the second sets of relationships to establish a system of equations in terms of the values at the distinct time points, wherein combining the first and the second sets of relationships comprises combining the first and second equations to produce a third equation $$(D_{T_c} \otimes I_N)\bar{v}_0 - \Phi_{T_c}(\bar{v}_0) = 0,$$

where $\otimes$ is a Kronecker product and $I_N$ is an N by N identify matrix; and (f) means for finding responses of the circuit at the distinct time points by solving the established system of equations, as defined by the third equation.

15. The apparatus of claim 14, wherein each of the reference time points is one signal period away from its respective distinct time point.

16. The apparatus of claim 14, wherein the means for establishing the first set of relationships further comprises:
   means for selecting a set of initial values at the distinct time points; and
   means for performing integration from the distinct time points to their respective reference time points to generate values between the distinct time points and the reference time points.

17. The apparatus of claim 16, wherein the values generated by the integration are in time domain, and wherein the means for establishing the first set of relationships further comprises:
   means for generating values reflecting circuit responses in time domain based on the values generated by the integration.

18. The apparatuses of claim 14, wherein the means for establishing the second set of relationships further comprises:
   means for selecting a set of initial values at the distinct time points;
   means for performing a forward multidimensional discrete Fourier transform on the initial values to transform the initial values from real values to complex values;
   means for performing a phase shift of a sampling period on the complex values; and
   means for performing an inverse multidimensional discrete Fourier transform to convert the phase shifted complex values to real values.

19. The apparatus of claim 14, wherein the means for finding responses of the circuit at distinct time points further comprises:
   means for solving the established system of equations by performing a discrete numeric solution method to generate the responses of the circuit at the distinct time points.

20. The apparatus of claim 19 wherein the discrete numeric solution method is Newton method.

21. The apparatus of claim 19 wherein the established system of equations is a system of nonlinear equations, the discrete numeric solution method contains solutions to a system of linear equations by applying implicit matrix iterative linear solvers to the linear equations, and wherein the means for finding responses of the circuit at distinct time points further comprises:
   (g) means for selecting a set of estimated values to reflect estimated circuit responses at the distinct time points;
   (h) means for establishing a system of linear equations at the estimated values;
   (i) means for preconditioning the system of linear equations to improve convergence of solution to the system of linear equations; and
   (j) means for solving the system of linear equations to generate correction values to adjust the estimated values.

22. The apparatus of claim 21, wherein the means for preconditioning the system comprises means for combining a delay matrix and a linear model of a state transition function to construct a preconditioner.

23. The apparatus of claim 22, further comprising:
   (k) means for using the adjusted estimated values as newly estimated values to reflect estimated circuit response at the distinct time points; and (l) means for determining whether the estimated values form a satisfactory solution to the established system of equations of means (e).

24. The apparatus of claim 23, wherein the estimated values are in time domain, the apparatus further comprising:
   (m) means for converting the estimated values into frequency domain.

25. The apparatus of claim 14, wherein the values between which the first set of relationships was established and the values between which the second set of relationships was established are voltages at the distinct time points and the reference time points.

26. A computer readable storage medium having computer loadable and executable instructions stored thereon, that, when loaded into a computer and executed, cause the computer to perform a method for simulating responses of an analog circuit using a mixed frequency time method, wherein the circuit receives a periodic sample signal and at least one information signal, the computer readable storage medium comprising instructions for:
   (a) selecting a set of evenly spaced distinct time points;
   (b) defining a set of reference time points, wherein each of the reference time points is associated with one of the distinct time points;
   (c) establishing a first set of relationships between values at the distinct time points and values at the reference time points, wherein the first set of relationships are defined by a first equation $$v^-_{Tc} = \Phi_{Tc}(v^-_0);$$

where $v^-_0$=vector of signals at distinct time points,
   $v^-_{Tc}$=vector of signals at reference time points,
   $\Phi_{Tc}$=multicycle transition function;
   (d) establishing a second set of relationships between the values at the distinct time points and the values at the reference time points, wherein the second set of relationships are by defined by a second equation $$v^{-n}_{Tc} = D_{Tc}(v^{-n}_0);$$

where $v^{-n}_0$=vector of signals at distinct time points, for boundary condition n,
   $v^{-n}_{Tc}$=vector of signals at reference time points, for boundary condition n,
   $D_{Tc}$=delay matrix;
   (e) combining the first and the second sets of relationships to establish a system of equations in terms of the values at the distinct time points, wherein combining the first and the second sets of relationships comprises combining the first and second equations to produce a third equation $$(D_{T_c} \otimes I_N)(\bar{v}_0 - \Phi_{T_c}(\bar{v}_0)) = 0,$$

where $\otimes$ is a Kronecker product and $I_N$ is an N by N identity matrix; and
   (f) finding responses of the circuit at the distinct time points by solving the established system of equations, as defined by the third equation.

27. The computer readable storage medium of claim 26, wherein each of the reference time points is one signal period away from its respective distinct time point.

28. The computer readable storage medium of claim 26, wherein instructions for establishing the first set of relationships further comprises instructions for:
   selecting a set of initial values at the distinct time points; and performing integration from the distinct time points to their respective reference time points to generate values between the distinct time points and the reference time points.

29. The computer readable storage medium of claim 28 further comprising instructions for saving to disk Jacobian matrices at integration time points.

30. The computer readable storage medium of claim 28, wherein the values generated by the integration are in time domain, and instructions for establishing the first set of relationships further comprises instructions for:
generating values reflecting circuit responses in time domain based on the values generated by the integration.

31. The computer readable storage medium of claim 26, wherein instructions for establishing the second set of relationships further comprises instructions for:
selecting a set of initial values at the distinct time points;
performing a forward multidimensional discrete Fourier transform on the initial values to transform the initial values from real values to complex values;
performing a phase shift of a sampling period on the complex values; and
performing an inverse multidimensional discrete Fourier transform to convert the phase shifted complex values to real values.

32. The computer readable storage medium of claim 26, wherein instructions for finding responses of the circuit at the distinct time points further comprises instructions for:
solving the established system of equations by performing a discrete numeric solution method to generate the responses of the circuit at the distinct time points.

33. The computer readable storage medium of claim 32, wherein the discrete numeric solution method is Newton method.

34. The computer readable storage medium of claim 32, wherein the established system of equations in step (e) is a system of nonlinear equations, the discrete numeric solution method contains solutions to a system of linear equations by applying matrix implicitly iterative linear solvers to the linear equations, and wherein instructions for finding responses of the circuit at the distinct time points further comprises instructions for:
(g) selecting a set of estimated values to reflect estimated circuit responses at the distinct time points;
(h) establishing a system of linear equations at the estimated values;
(i) preconditioning the system of linear equations to improve convergence of solution to the system of linear equations; and
(j) solving the system of linear equations to generate correction values to adjust the estimated values.

35. The computer readable storage medium of claim 34, wherein instructions for preconditioning the system of linear equations comprises instructions for using a combination of a delay matrix and a linear model of a state transition function to construct a preconditioner.

36. The computer readable storage medium of claim 34, further comprising instructions for:
(k) using the adjusted estimated values as newly estimated values to reflect estimated circuit response at the distinct time points; and
(l) repeating steps (g)-(k) until the estimated values form a satisfactory solution to the system of equations established in step (e).

37. The computer readable storage medium of claim 36, wherein the estimated values are in time domain, the medium further comprising instructions for:
(m) converting the estimated values into frequency domain.

38. The computer readable storage medium of claim 26, wherein the values between which the first set of relationships was established and the values between which the second set of relationships was established are voltages at the distinct time points and reference time points.

* * * * *